United States Patent
Scheuerlein

[11] Patent Number: 6,097,625
[45] Date of Patent: Aug. 1, 2000

[54] MAGNETIC RANDOM ACCESS MEMORY (MRAM) ARRAY WITH MAGNETIC TUNNEL JUNCTION (MTJ) CELLS AND REMOTE DIODES

[75] Inventor: Roy Edwin Scheuerlein, Cupertino, Calif.

[73] Assignee: International Business Machines Corporation, Armonk, N.Y.

[21] Appl. No.: 09/116,261

[22] Filed: Jul. 16, 1998

[51] Int. Cl.⁷ .................................................. G11C 11/14
[52] U.S. Cl. ........................................... 365/171; 365/173
[58] Field of Search .................................. 365/171, 173, 365/172, 158, 148

[56] References Cited

U.S. PATENT DOCUMENTS

| | | |
|---|---|---|
| 5,347,485 | 9/1994 | Taguchi et al. . |
| 5,361,226 | 11/1994 | Taguchi et al. . |
| 5,448,515 | 9/1995 | Fukami et al. . |
| 5,640,343 | 6/1997 | Gallagher et al. . |
| 5,768,181 | 6/1998 | Zhu et al. ................................. 365/158 |
| 5,793,697 | 8/1998 | Scheuerlein ......................... 365/230.07 |

*Primary Examiner*—David Nelms
*Assistant Examiner*—Gene N. Auduong
*Attorney, Agent, or Firm*—Thomas R. Berthold; Banner & Witcoff, Ltd.

[57] ABSTRACT

A nonvolatile memory cell includes a substrate, a diode, a first conductive line, a magnetic tunnel junction device, a by-pass conductor and a second conductive line. The diode is formed in the substrate and includes an n-type region and a p-type region. The first conductive line is formed on the substrate and is electrically connected to the n-type region of the diode. The magnetic tunnel junction device is formed on the first conductive line. The by-pass conductor electrically connects the p-type region of the diode to the magnetic tunnel junction device. The second conductive line is formed on and is electrically connected to the magnetic tunnel junction device.

26 Claims, 10 Drawing Sheets

MAGNETIC RANDOM ACCESS MEMORY (MRAM) ARRAY WITH MAGNETIC TUNNEL JUNCTION (MTJ) CELLS AND REMOTE DIODES

The U.S. Government has a paid-up license in this invention and the right in limited circumstances to require the patent owner to license others on reasonable terms provided for by the terms of contract No. MDS 972-96-C0014 awarded by the Advanced Research Projects Agency.

BACKGROUND OF THE INVENTION

1. Field of the Invention

The present invention relates to the field of data storage. More particularly, the present invention relates to a physical configuration of a magnetic tunnel junction (MTJ) device memory cell.

2. Description of the Related Art

U.S. Pat. No. 5,640,343 to Gallagher et al. discloses two configurations of a magnetic tunnel junction (MTJ) device memory cell. The first configuration, shown in FIGS. 1B and 1C of U.S. Pat. No. 5,640,343, represents an ideal cross point array structure that uses a thin film diode. The second configuration, shown in FIGS. 10A–10C, includes a buried row line that uses a single crystal silicon diode, but requires an additional global row line to be formed on top of the memory cell.

The quality of thin film diodes limits the first configuration to low sense currents and, consequently, a slower operational performance. The second configuration has a large spacing between the global row line and the magnetic element that requires a larger current through the row line when writing the cell than that through the row line of the first configuration. Additionally, the safety margin associated with the second configuration for avoiding writing of an adjacent cell is small and, with variability in materials, the second configuration has insufficient margin for operating cells one at a time in a large dense array. The first configuration similarly has a large spacing between the MTJ device and the row line, caused by the intervening diode, which reduces the write margin.

Consequently, what is needed is an MTJ memory cell configuration that has an improved write margin and a lower write current over conventional MTJ memory cell configurations, while also providing a smaller cell size.

SUMMARY OF THE INVENTION

The present invention provides an MTJ memory cell configuration having an improved write margin and a lower write current over conventional MTJ memory cell configuration. Additionally, the present invention provides an MTJ memory cell configuration that provides a smaller memory cell size. Additionally, the present invention provides a memory cell having a higher performance. The advantages of the present invention are provided by a nonvolatile memory cell that includes a substrate, a diode, a first conductive line, a magnetic tunnel junction device, a by-pass conductor and a second conductive line. The diode is formed in the substrate, and includes an n-type region and a p-type region. The first conductive line is formed on the substrate and is electrically connected to the n-type region of the diode. The magnetic tunnel junction device is formed on the first conductive line, and the by-pass conductor electrically connects the p-type region of the diode to the magnetic tunnel junction device. Preferably, the by-pass conductor is connected to the p-type region of the diode below the first conductive line, and can be formed using a lithographic technique or a sidewall deposition technique. The second conductive line is formed on and is electrically connected to the magnetic tunnel junction device. The nonvolatile memory cell can also include a region of polysilicon gate material that is formed on the diode below the first conductive line.

In a second embodiment, the by-pass conductor is connected to a control electrode of a transistor. In a third embodiment, the by-pass conductor is connected to a transistor having a control electrode that is attached to a row (word) line. In a fourth embodiment, the by-pass conductor is connected to a transistor having a control electrode that is attached to a control line.

BRIEF DESCRIPTION OF THE DRAWING

The present invention is illustrated by way of example and is not limited by the accompanying figures in which like reference numerals indicate similar elements and in which.

DETAILED DESCRIPTION

The present invention provides a non-volatile MTJ MRAM memory cell having a physical arrangement of the cell elements on the substrate that are in a different order than the order of electrical connection through the cell. Additionally, the MTJ memory cell of the present invention has a close spacing of the row line and the bit line connected to the MTJ memory cell. The present invention provides low parasitic conductor resistance in series with the sense path. The present invention also provides a good quality single crystal silicon diode that has low resistance. In a second embodiment, the present invention provides a good quality sense conductor transistor that has low resistance. Further, the MTJ cell of the present invention provides lower write currents that allow memory arrays to be scaled to smaller dimensions accordingly without being limited by IR drops or electromigration. The MTJ cells of the present invention can be sensed in 20 nanoseconds due to the sense path being through a single MTJ, the low resistance of the diode or transistor and low parasitic resistance.

Figure 1:
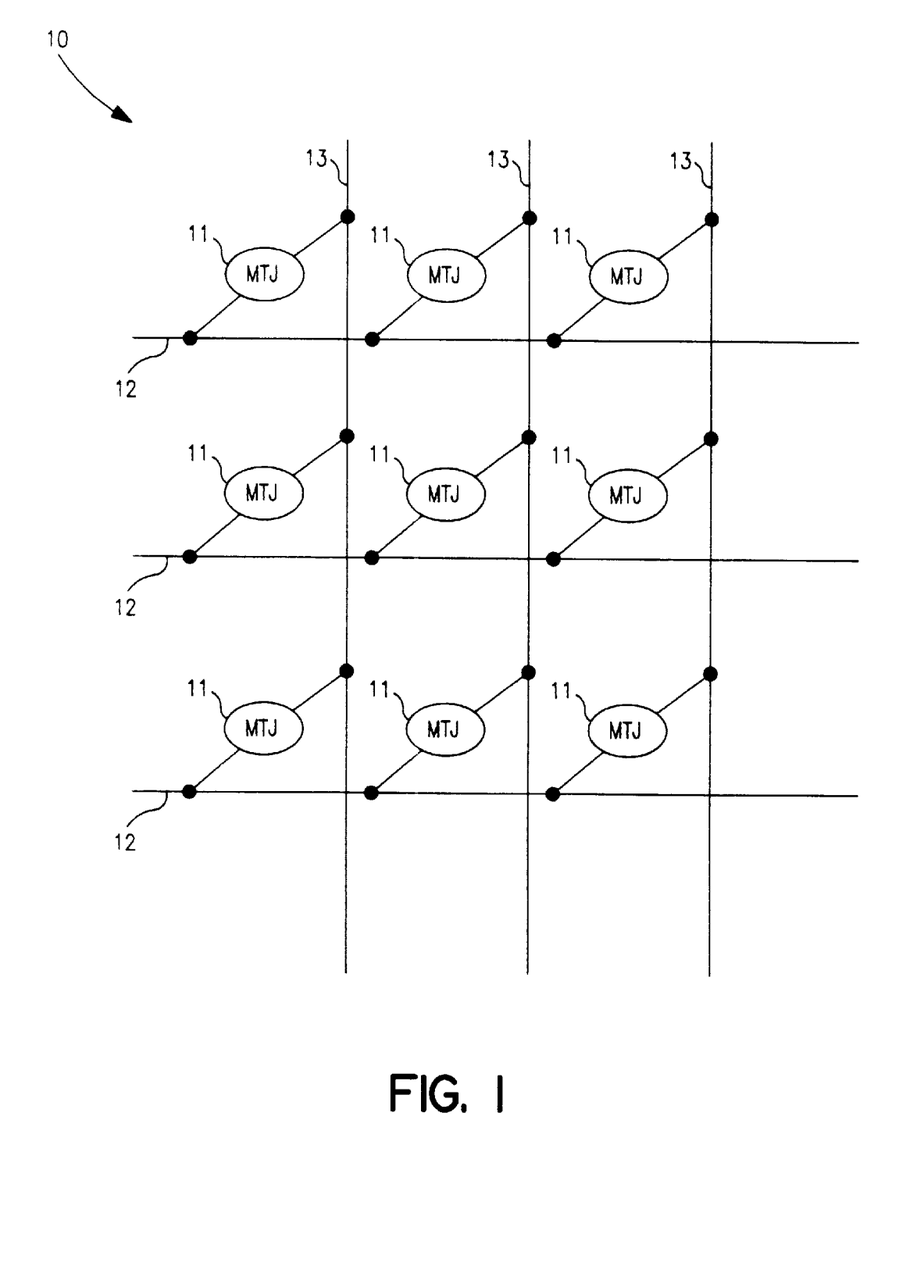
FIG. 1 depicts a cross point array having a plurality of magnetic tunnel junction memory cells.

FIG. 1 depicts a cross point array 10 having a plurality of magnetic tunnel junction (MTJ) memory cells 11. Cross point array 10 includes a plurality of row lines 12 (also referred to as word lines) and a plurality of column lines 13 (also referred to as sense lines) that are perpendicular and pass over row lines 12. An MTJ memory cell 11 is located at an intersection region of a row line 12 and a column line 13. Memory cell 11 consists of an MTJ and an isolation device, such as a diode or a transistor, connected in series between a row line 12 and a column line 13. U.S. Pat. No. 5,640,343 to Gallagher et al. and application Ser. No. 08/982,995 to Gallagher et al., filed Dec. 2, 1997, both disclose suitable MTJ devices for MTJ memory cells 11, and are both incorporated by reference herein.

Figure 2A:
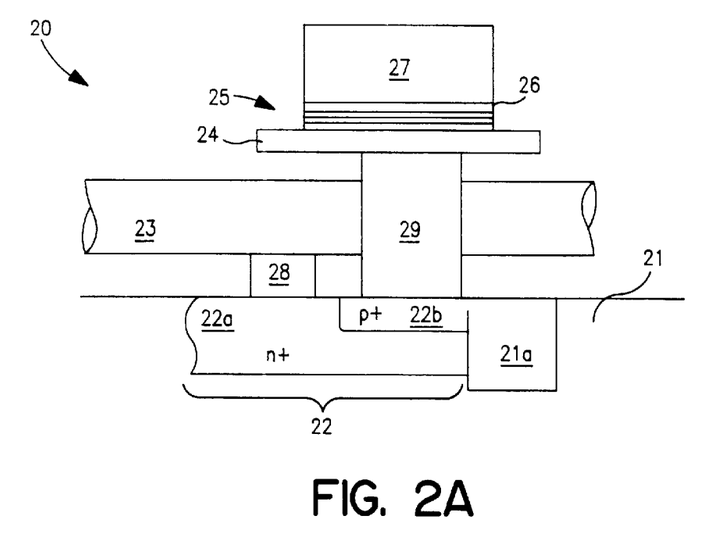
FIG. 2A shows a cross section of the vertical arrangement of an MTJ cell according to the present invention as viewed through a column line.
Figure 2B:
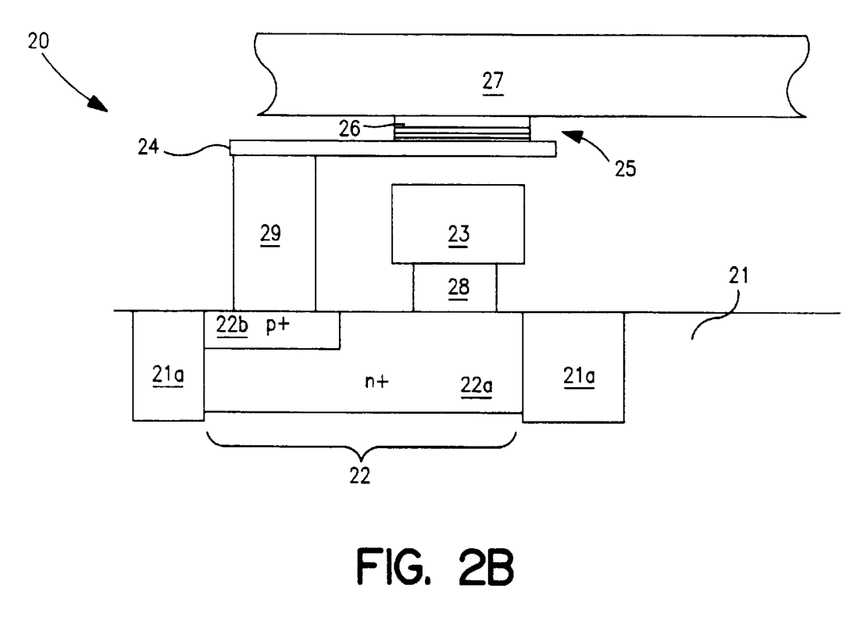
FIG. 2B shows a cross section of the vertical arrangement of an MTJ cell according to the present invention as viewed through a row line.
Figure 3:
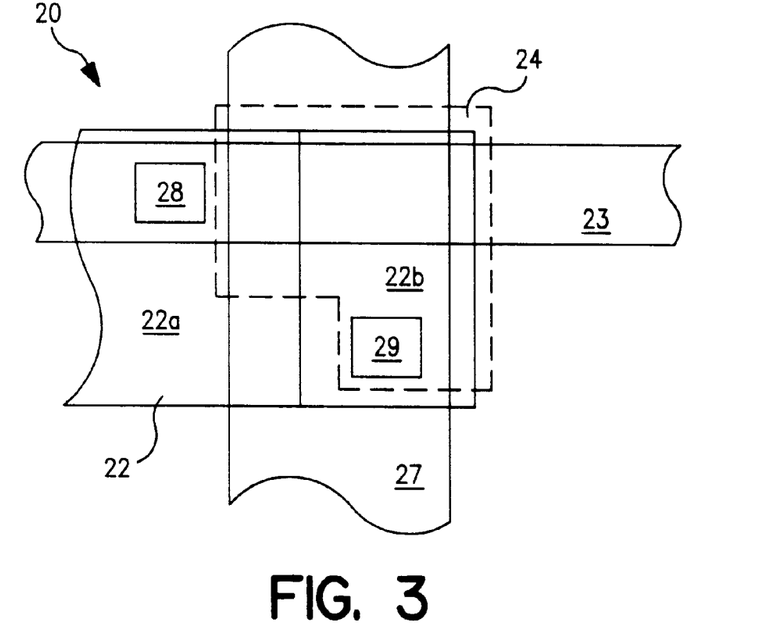
FIG. 3 shows a plan view of an MTJ cell according to the present invention.

FIG. 2A shows a cross section of the vertical arrangement of a MTJ cell 20 according to the present invention as viewed through a column line. FIG. 2B shows a cross section of the vertical arrangement of MTJ cell 20 as viewed through a row line. FIG. 3 shows a plan view of MTJ cell 20 according to the present invention.

Referring to FIGS. 2A, 2B and 3, the physical arrangement of cell 20 on a substrate 21 from bottom to top is first a diode 22, next a first conductor 23 (row line) that is used to write cell 20, then a lower electrode contact metal layer 24 of the MTJ, the MTJ magnetic layers 25, a top electrode contact metal layer 26 of the MTJ, and lastly a second conductor (column line) 27 that is also used to write cell 20.

Diode 22 includes an $n^+$-type region 22a and a $p^+$-type region 22b. $n^+$-type region 22a is formed by an ion implantation process resulting in a junction depth of about 0.4 $\mu$m deep, and extends under a $p^+$-type region 22b. $p^+$-type region 22b is formed by a shallow ion implantation process resulting in a junction depth of about 0.1 $\mu$m. No salicide is allowed to form on top of $n^+$-type region 22a or $p^+$-type region 22b, as is often formed on submicron CMOS VLSI, because diode 22 would be shorted. An insulator 21a is formed in substrate 21 in a well-known manner for defining a boundary for diode 22.

$n^+$-type region 22a is connected to row line conductor 23 through a conductor 28, such as a metal contact, formed through an insulation layer (not shown) between $n^+$-type region 22a and row line conductor 23. A by-pass conductor 29 connects lower electrode contact metal layer 24 to $p^+$-type region 22b. By-pass conductor 29 is formed by a via through a thin insulator (not shown) between diode 22 and a small amount of metal material formed on the same level as row line conductor 23, and a via between the small amount of metal material formed on the same level as row line conductor 23 and lower electrode contact metal layer 24. A contact to p+ diffusion region 22b is filled with contact metal.

The order of electrical connection of the elements forming MTJ cell 20 is different than the physical order that the elements are formed on substrate 21. The order of electrical connection starts with row line conductor 23 connected to $n^+$-type region 22a of diode 22. $p^+$-type region 22b of diode 22 is connected to lower electrode 24, which in turn is connected to MTJ 25. MTJ 25 is connected to column line conductor 27. The "out-of-order" electrical connection sequence (in comparison to the physical configuration) provides MTJ cell 20 with a lower write current in the row line. Additionally, a larger difference in the magnetic fields is produced by the write current at a selected MTJ cell in an array of cells with respect to an adjacent MTJ cell. This difference produces a large write margin so that a single cell in an array can be written. The physical configuration provides an isolation device of a diode formed in the silicon substrate that is of high quality and low resistance. The high quality and low resistance allow low total resistance in the MTJ cell and, therefore, high performance that would otherwise be limited by a time constant equal to the resistance in the sense path and capacitance on the column sense line.

Figure 4:
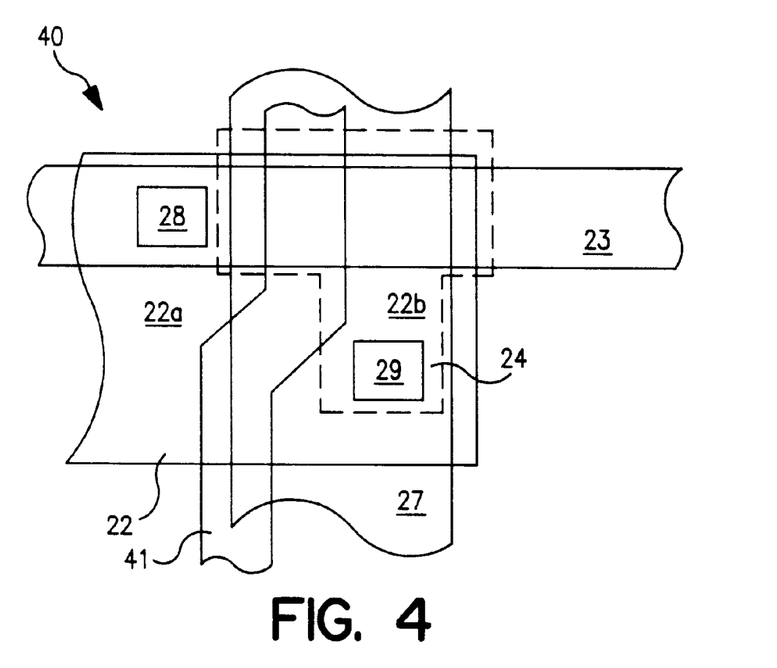
FIG. 4 shows a plan view of a first preferred configuration of an MTJ memory cell according to the present invention.

FIG. 4 shows a plan view of a first preferred configuration of an MTJ memory cell 40 according to the present invention. MTJ cell 40 includes a region of polysilicon gate material 41, as is commonly available in CMOS VLSI, that defines the edge of $p^+$-type region 22b from $n^+$-type region 22a. The configuration of cell 40 allows normal salicide formation to be used on the surfaces of $n^+$-type region 22a and $p^+$-type region 22b because no salicide is formed under the polysilicon gate and, consequently, diode 22 is not shorted. The polysilicon gate region 41 is preferably connected to a ground potential for controlling the electric field at the edge of $p^+$-type region 22b. The use of salicide on the surface of the $n^+$-type region and $p^+$-type region further reduces series resistance of the diode and leads to even higher performance sensing.

Figure 5:
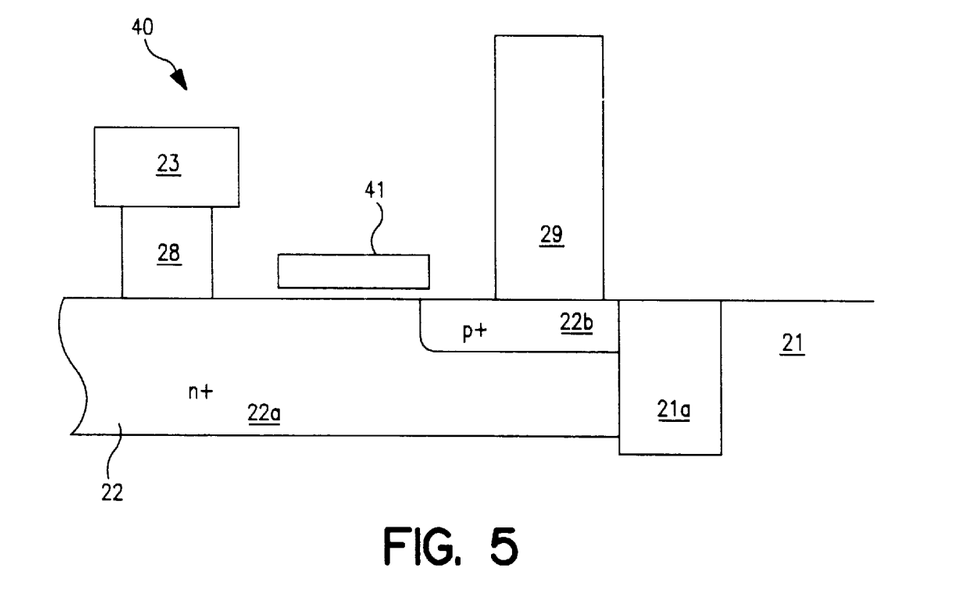
FIG. 5 shows a cross section of the first preferred configuration of an MTJ cell according to the present invention as viewed through a row line.

FIG. 5 shows a cross section of the first preferred configuration of MTJ cell 40 as viewed through a row line. $p^+$-type region 22b preferably has a peak dopant concentration of about $1 \times 10^{19}$ dopant atoms per cm$^3$, while $n^+$-type region 22a preferably has a peak dopant concentration of $1-4 \times 10^{19}$ dopant atoms per cm$^3$. In a preferred embodiment, $n^+$-type region 22a is about 0.4 $\mu$m thick and $p^+$-type region is about 0.1 $\mu$m thick. Row line conductor 23 is about 0.4 $\mu$m thick. A thin insulator (not shown) between row line conductor and the lower electrode conductor layer 24 is about 0.2 $\mu$m thick. Column line conductor 27 is about 0.4 $\mu$m thick. An MTJ memory cell, fabricated using CMOS technology, is about 4 times feature size by about 5 times feature size, and is a small fraction of a conventional Static Random Access Memory (SRAM) cell fabricated using the same ground rules (~25 $\mu^2$).

Figure 6:
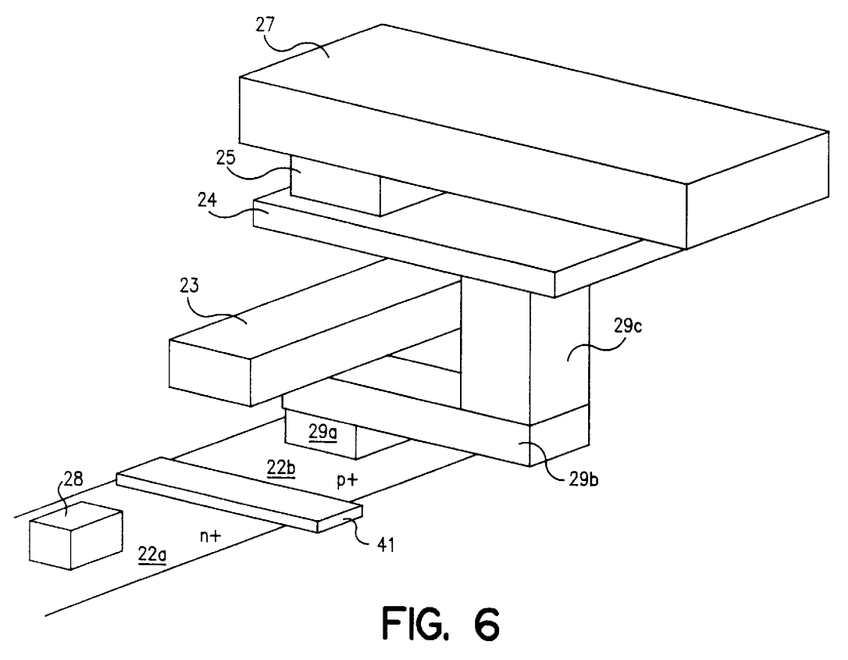
FIG. 6 shows a perspective view of a second preferred configuration of an MTJ cell according to the present invention.

FIG. 6 shows a perspective view of a second preferred configuration of an MTJ cell 60 according to the present invention that provides an even more compact cell layout than the first preferred configuration shown in FIGS. 4 and 5. MTJ cell 60 includes a by-pass conductor 29 having a first portion 29a, a second portion 29b and a third portion 29c. Second portion 29a is an extra level of metal wiring that is located below row line conductor 23 is used for connecting by-pass conductor 28 to $p^+$-type region 22b, which in turn, can be partially below the row line thus saving space. Portion 29b of by-pass conductor 29 effectively extends under row line conductor 23. The connection between row line conductor 23 and $n^+$-type region 22a of diode 22 can be shared by adjacent MTJ cells to further save space. In FIG. 6, only a portion of conductor 28 is shown.

By-pass connection 29 from the lower electrode of MTJ to the extra layer of metal 29a can be formed in various ways and of various materials. Since only the current required to read the cell passes through the by-pass connection 29 (on the order of microamps), a polysilicon material, thin metal layers, or a metallic silicon alloys, such as TiSi can be used. By-pass connection 29 can be formed by independent shapes using well-known lithographic techniques.

Figure 7:
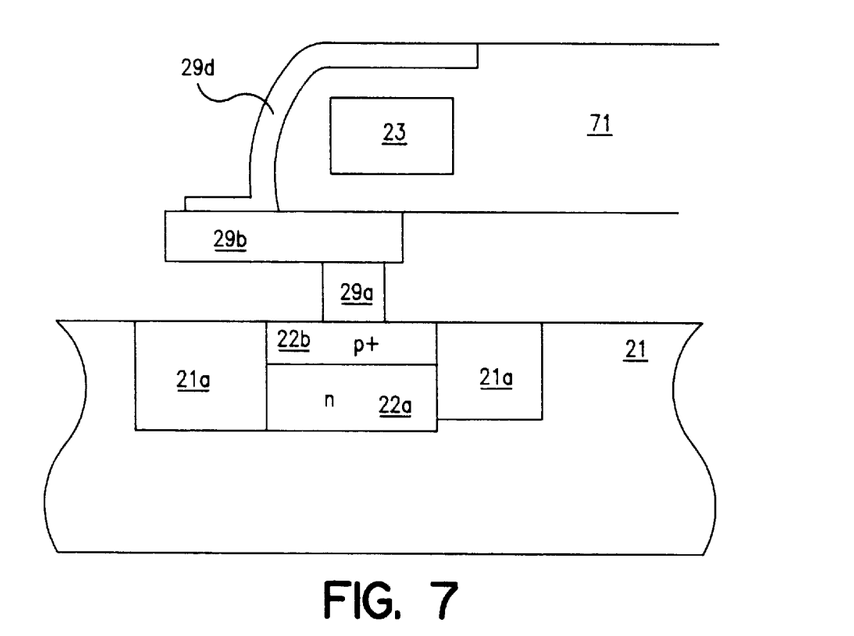
FIG. 7 shows a cross section of an MTJ cell illustrating a by-pass connection formed by a sidewall deposition technique.

By-pass connection 29 can also be formed using a well-known sidewall deposition technique, such as shown in FIG. 7. The row line conductor 23 is formed from a metal that is compatible with temperatures used when depositing silicon, such as tungsten. The tungsten row line is covered on its top and sides by an insulator 71. A thin conductor material 29d is formed on the top and at least one side of insulator 71 for connecting from extra level of metal 29b to MTJ layer 25, which is located on top of thin conductor material 29d. Preferably, thin conducting material 29d is made from titanium, titanium nitride, titanium silicide, or any similar metallic layers that forms a reliable conductor on the side of an insulating coating. Thin conductor material 29d is removed, using a well-known photo-lithographic process, between the areas in the MTJ cell where the connection to the extra metal layer 29b is not required.

Figure 8A:
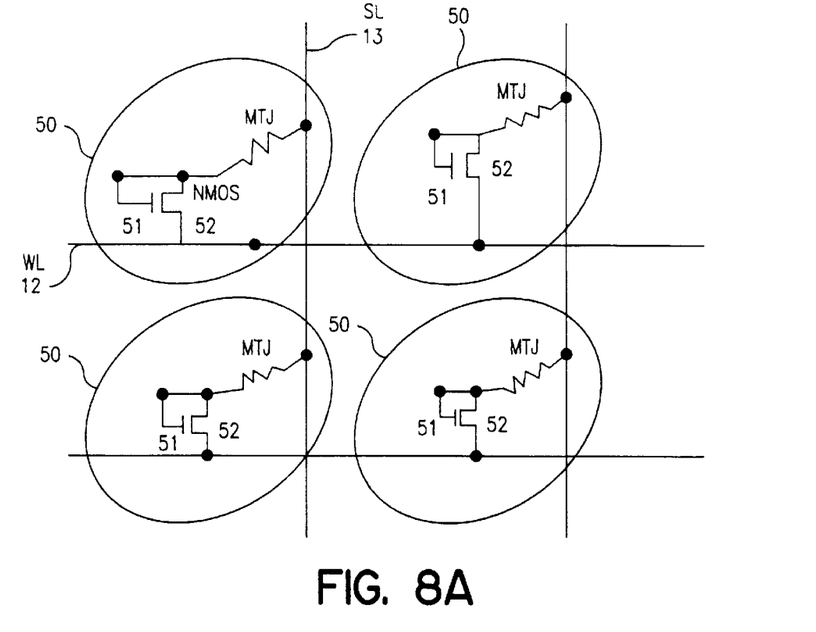
FIGS. 8A and 8B respectively show schematic block diagrams of an array of MTJ cells each having a transistor as an isolation device according to the present invention.
Figure 8B:
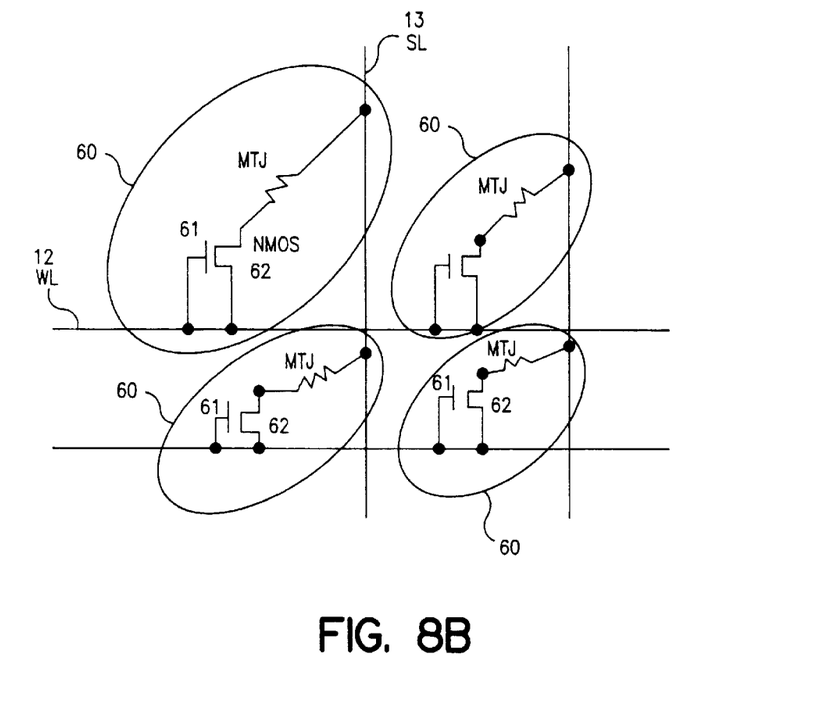

FIG. 8A shows a schematic block diagram of an embodiment of the present invention having an NMOS transistor 52 connected in series with the MTJ to form a memory cell 50. A word line 12 is selected by bringing the voltage on the word line to be near ground. FIG. 8B shows a schematic block diagram of a preferred embodiment of the present invention having an NMOS transistor 62 connected in series with the MTJ. A control electrode 61 of NMOS transistor 62 is connected to a word line 12 that is selected by bringing the voltage on the word line to be more positive than the voltage on unselected word lines. The capacitance on a sense line 13 is lower for FIG. 8B than for a sense line in FIG. 8A because only the drain of transistor 62 is connected to the MTJ, thus contributing to the capacitance of the sense line. Additionally, the polarity of the voltage of the sense line with respect to the word line can be reversed by changing NMOS transistor 52 to be a PMOS transistor.

Figure 9A:
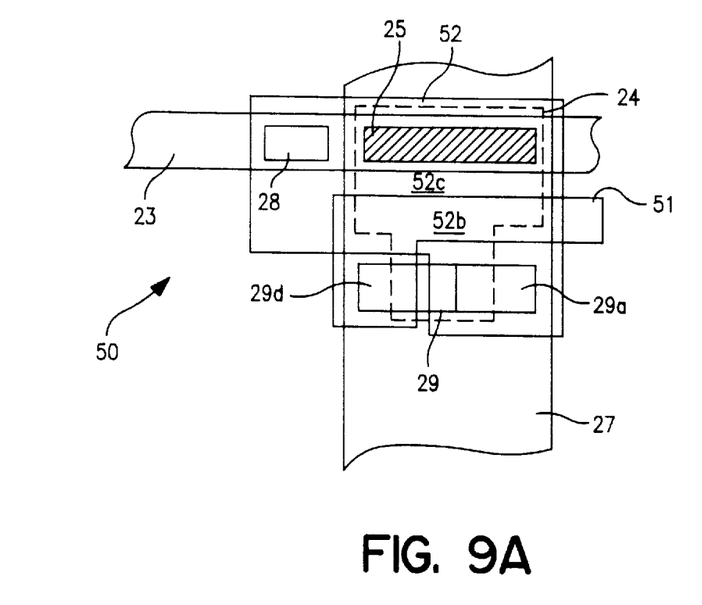
FIGS. 9A and 9B respectively show different plan views of an MTJ cell having a transistor connected to the MJT cell and to a control line according to the present invention.
Figure 9B:
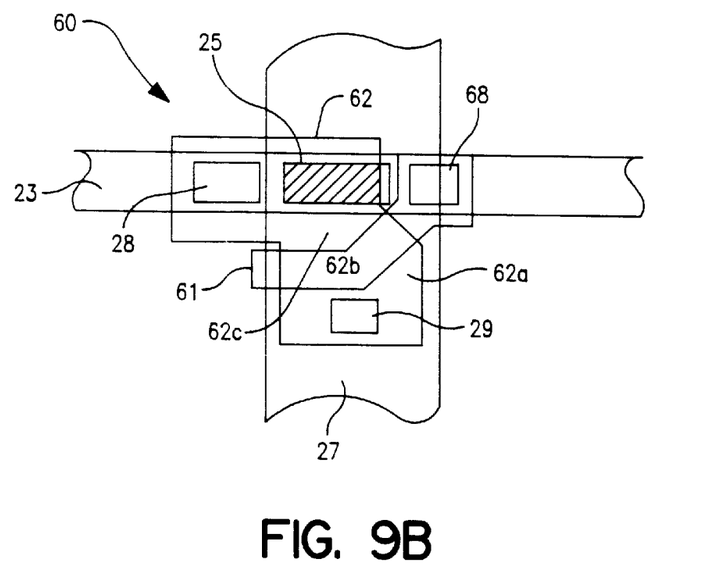
Figure 10A:
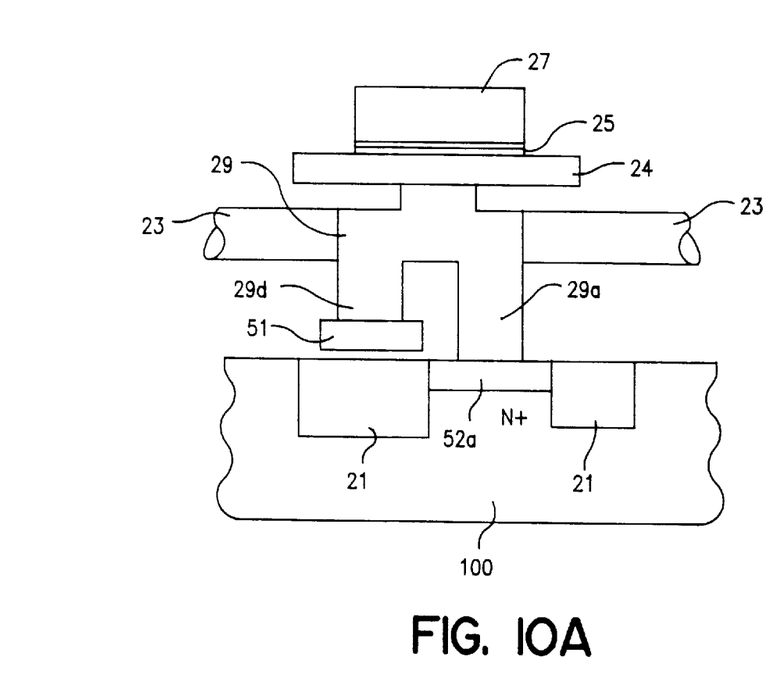
FIGS. 10A and 10B respectively show a partial sectional view through a sense line of the MTJ cells of FIGS. 9A and 9B.
Figure 10B:
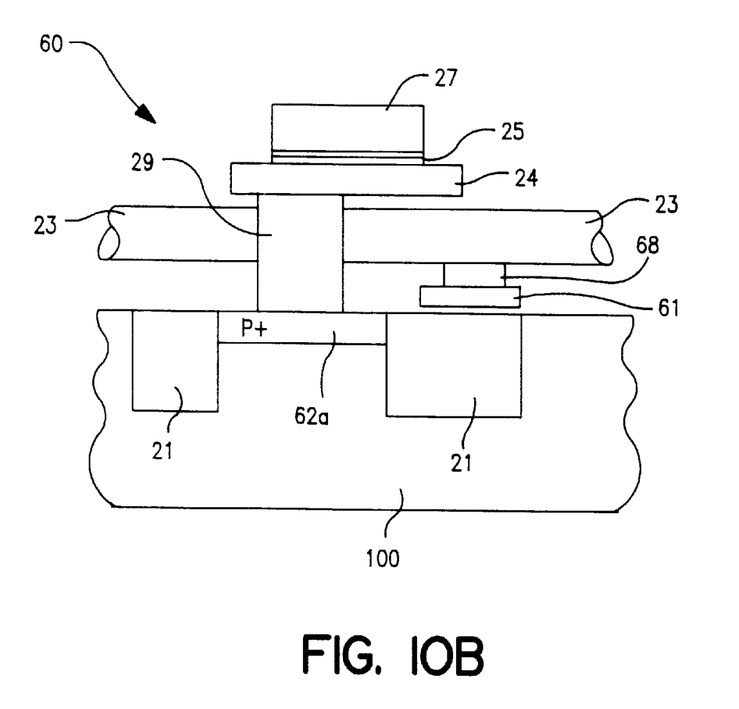

FIGS. 9A and 9B respectively show different plan views of an MTJ cell 50 and 60 formed in a substrate 100 and each having a transistor connected to the MJT cell and to a control line according to the present invention. FIGS. 10A and 10B respectively show a partial sectional view through a sense line of the MTJ cells of FIGS. 9A and 9B. FIGS. 9A and 10A show a polysilicon gate conductor 51 connected to an MTJ 25 by an additional portion of by-pass conductor 29 at polysilicon contact region 29d. The polysilicon gate conductor is the control terminal of an NMOS transistor, such as NMOS transistor 62 shown in FIG. 8B. The NMOS transistor consists of an MOS device active region 52 having an n$^+$-type drain 52a connected to by-pass conductor 29 at diffusion contact region 29a, a channel region 52b, and a source region 52c connected to a word line 23 by an n$^+$-type contact region 28. Contact region 28 can be shared with an adjacent cell.

FIGS. 9B and 10B show a polysilicon gate 61 connected to word line 23 by polysilicon contact conductor 68, the gate 61 is the control electrode of transistor 62, with drain region 62c connected to the word line by an n$^+$-type contact region 28 and source region 62a that is connected to a by-pass conductor 29.

Figure 11:
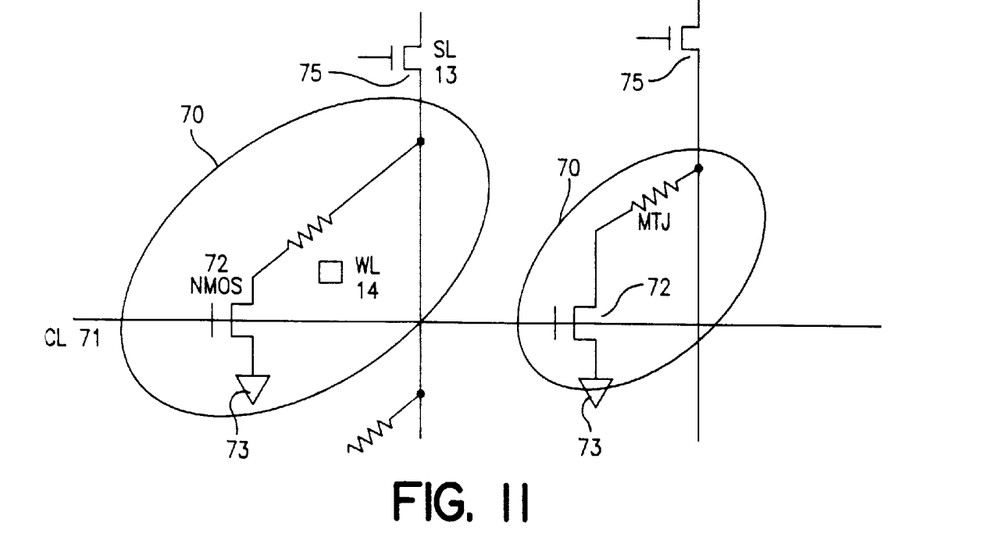
FIG. 11 shows a schematic block diagram of an embodiment of the present invention having a by-pass conductor that is connected to ground.

FIG. 11 shows a schematic block diagram of an embodiment of the present invention having a by-pass conductor that is connected to ground. In FIG. 11, arrays of MTJ cells 70 are formed from cell columns that share a sense line 13, and rows 15 that share a word line and a transistor control line. Selection devices 75 connected to sense lines 13 control the connection of one or more cells 70 to one or more sensing circuits (not shown), respectively.

Writing all of the embodiments of the present invention can be accomplished by passing currents through the sense line and word line that generate magnetic fields that add together at the intersection region to write a cell at the intersection region. This is most easily accomplished in the embodiment of FIG. 11 when the control lines 15 can be used to turn off all the transistors in the array so that IR drops in a sense line 13 does not cause current to flow through any cells 70.

Cell 70 is also preferred because the low resistance in transistor 72 reduces time constants for the sense line, and increases signal because the resistance of the MTJ being sensed is larger in comparison to the transistor resistance. The resistance of NMOS transistor 72 in cell 70 can be smaller than the isolation devices of the other embodiments of the present invention because the voltage on the control line can be as high as the supply voltage for the memory array and is not restricted by any connection to the sense path in the cell. The resistance of NMOS transistor 72 can be substantially less than 1 kOhm and allows memory cell 70 to be sensed in less than 20 nanoseconds. The state of the MTJ device in a cell is sensed by comparing its resistance to the resistance of a reference resistor that is known to have a value that is between the highest and lowest values of resistances for the MTJ device in the cell. The reference resistor is preferably an MTJ device having a parallel magnetization direction and slightly smaller area than the cell MTJ.

Figure 14:
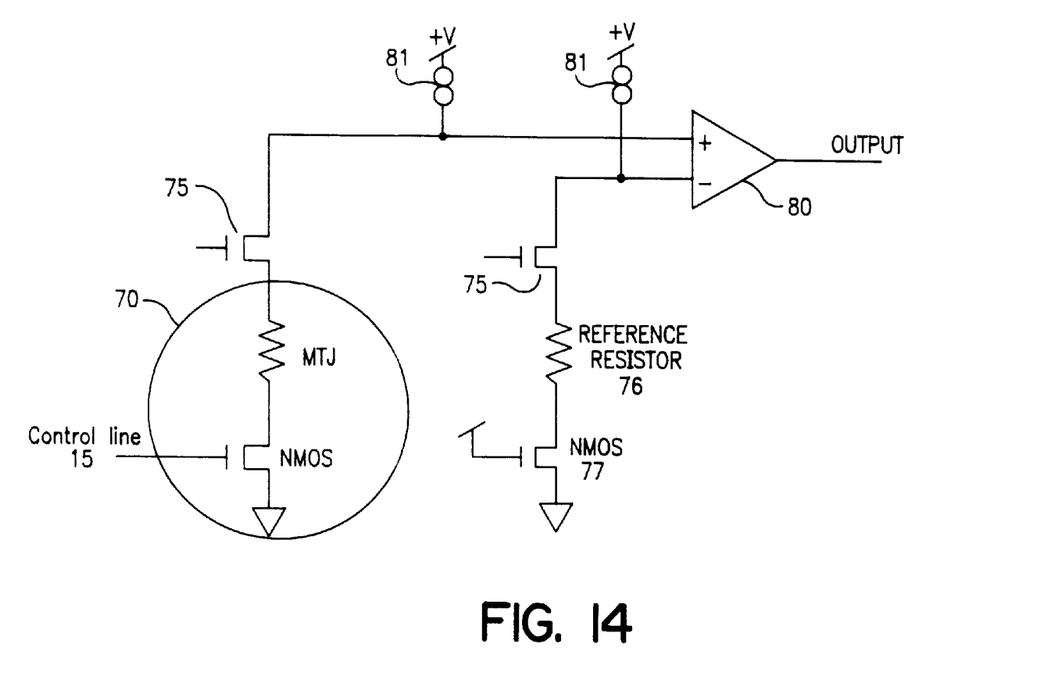
FIG. 14 is a schematic block diagram of an MTJ cell connected to an amplifier that generates an output directly from the resistance value of the MTJ of the cell according to the present invention.

FIG. 14 is a schematic block diagram of an MTJ cell 70 connected to an amplifier 80. Two matched current sources 81 are respectively connected to cell 70 and to a circuit having a selection device 75, a reference resistor 76 and an NMOS transistor 77. Amplifier 80 produces a high or low voltage output directly from the resistance value of the MTJ device in the cell, and has a short sensing time constant due to low resistance in the MTJ cell. Conventional magnetoresistive memories have a much longer sensing time than that of the present invention because direct sensing was not possible. Previously, two step sensing was necessary, which included modifying the magnetization direction in the cell magnetic layers and referencing the amplifier to earlier values of resistance in the cell magnetoresistive element.

Figure 12:
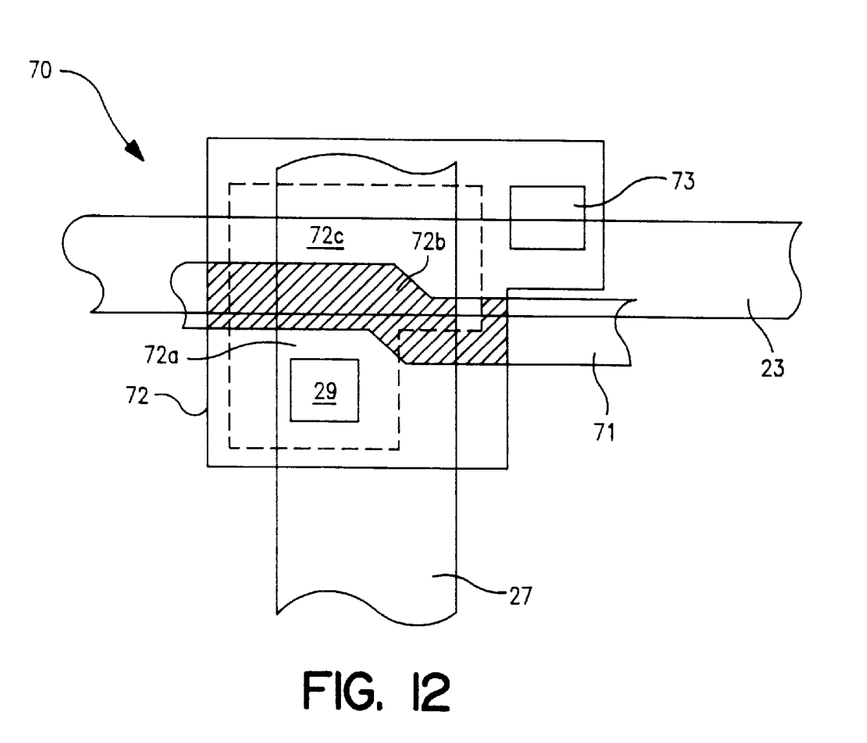
FIG. 12 shows a plan view of the MTJ cell shown in FIG. 11.
Figure 13:
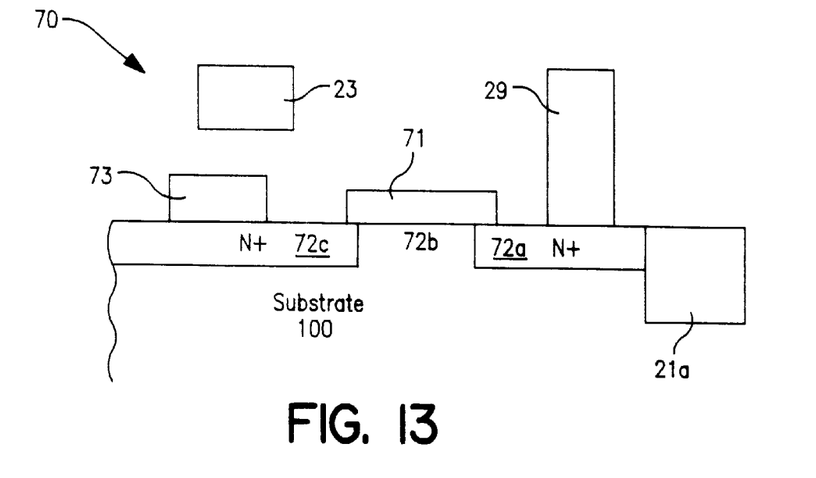
FIG. 13 shows a partial sectional view diagram through a word line of the MTJ cell shown in FIG. 11.

FIG. 12 shows a plan view of MTJ cell 70 shown in FIG. 11. FIG. 13 shows a partial sectional view through a word line of the MTJ cell of FIG. 11. Word line 23 passes through cell 70 under the MTJ device, but is not electronically connected to the sense path through cell 70. The connection to electrical ground can be shared by four cells in the same area. The control line of the transistor 72 is a polysilicon line passing through the cell generally perpendicular to the sense line. Drain region 72a is connected to by-pass conductor 29 and source region 72c is connected to electrical ground at 73. The gate region of transistor 72 is shown at 72b.

While the present invention has been described in connection with the illustrated embodiments, it will be appreciated and understood that modifications may be made without departing from the true spirit and scope of the invention.

What is claimed is:

1. A nonvolatile memory cell, comprising:

a substrate;

an isolation device formed in the substrate, the isolation device including at least a first region and a second region in the substrate;

a first conductive line formed on the substrate;

a magnetic tunnel junction device formed over the first conductive line;

a by-pass conductor electrically connecting the first region of the isolation device to the magnetic tunnel junction device; and a second conductive line formed on and being electrically connected to the magnetic tunnel junction device.

2. The nonvolatile memory cell according to claim 1, wherein the isolation device is a diode, and wherein the second region is electrically connected to the first conductive line.

3. The nonvolatile memory cell according to claim 2, wherein the first region is a p-type region and the second region is an n-type region.

4. The nonvolatile memory cell according to claim 2, wherein the first region is an n-type region and the second region is a p-type region.

5. The nonvolatile memory cell according to claim 2, further comprising a region of polysilicon gate material formed on the diode below the first conductive line.

6. The nonvolatile memory cell according to claim 2, wherein the by-pass conductor is connected to the first region of the diode below the first conductive line.

7. The nonvolatile memory cell according to claim 2, wherein the by-pass conductor is formed using a lithographic technique.

8. The nonvolatile memory cell according to claim 2, wherein the by-pass conductor is formed using a sidewall deposition technique.

9. The nonvolatile memory cell according to claim 2, wherein the nonvolatile memory cell is about 1.6 $\mu$m or less by about 1.92 $\mu$m or less in size.

10. The nonvolatile memory cell according to claim 1, wherein the isolation device is a metal-oxide semiconductor transistor, the first region is a drain region, the second region is a source region that is electrically connected to the first conductive line, and the metal-oxide semiconductor transistor includes a gate region that is electrically connected to the by-pass conductor.

11. The nonvolatile memory cell according to claim 1, wherein the isolation device is a metal-oxide semiconductor transistor, the first region is a source region, the second region is a drain region that is electrically connected to the first conductive, line, and the metal-oxide semiconductor transistor includes a gate region that is electrically connected to the first conductive line.

12. The nonvolatile memory cell according to claim 1, wherein the isolation device is a metal-oxide semiconductor transistor, the first region is a drain region and the second region is a source region that is electrically connected to a ground potential, the metal-oxide semiconductor transistor further including a gate region that is electrically connected to a control line.

13. The nonvolatile memory cell according to claim 12, further comprising:

a reference resistor corresponding to the nonvolatile memory cell; and an amplifier having a first input and a second input, the first input being electrically connected to the second conductive line, the second input being electrically connected to the reference resistor, the amplifier outputting a signal related to a sensed resistance of the magnetic tunnel junction device with respect to a sensed resistance of the reference resistor.

14. A nonvolatile memory cell array, comprising:

a substrate;

a plurality of first conductive lines, each first conductive line being formed on the substrate;

a plurality of second conductive lines overlapping the first conductive lines at a plurality of intersection regions; and a plurality of nonvolatile memory cells, a nonvolatile memory cell being formed at an intersection region, each nonvolatile memory cell including, an isolation device formed in the substrate, the isolation device including a first region and a second region in the substrate;

a magnetic tunnel junction device formed over the first conductive line;

a by-pass conductor electrically connecting the first region of the isolation device to the magnetic tunnel junction device; and a second conductive line of the plurality of second conductive lines being formed on and being electrically connected to the magnetic tunnel junction device.

15. The nonvolatile memory cell array according to claim 14, wherein the isolation device is a diode, and the second region is electrically connected to a first conductive line of the plurality of first conductive lines.

16. The nonvolatile memory cell array according to claim 15, wherein the first region is a p-type region and the second region is an n-type region.

17. The nonvolatile memory cell array according to claim 15, wherein the first region is an n-type region and the second region is a p-type region.

18. The nonvolatile memory cell array according to claim 15, wherein the nonvolatile memory cell includes a region of polysilicon gate material formed on the diode below the first conductive line.

19. The nonvolatile memory cell array according to claim 15, wherein the by-pass conductor is connected to the first region of the diode below the first conductive line.

20. The nonvolatile memory cell array according to claim 15, wherein the by-pass conductor is formed using a lithographic technique.

21. The nonvolatile memory cell array according to calling 15, wherein the by-pass conductor is formed using a sidewall deposition technique.

22. The nonvolatile memory cell array according to claim 15, wherein the nonvolatile memory cell is about 1.6 $\mu$m or less by about 1.92 $\mu$m or less in size.

23. The nonvolatile memory cell array according to claim 14, wherein the isolation device is a metal-oxide semiconductor transistor, the first region is a drain region, the second region is a source region that is electrically connected to a first conductive line of the plurality of first conductive lines, and the metal-oxide semiconductor transistor includes a gate region that is electrically connected to the by-pass conductor.

24. The nonvolatile memory cell array according to claim 14, wherein the isolation device is a metal-oxide semiconductor transistor, the first region is a source region, the second region is a drain region that is electrically connected to a first conductive line of the plurality of first conductive lines, and the metal-oxide semiconductor transistor includes a gate region that is electrically connected to the first conductive line.

25. The nonvolatile memory cell array according to claim 14, wherein the isolation device is a metal-oxide semiconductor transistor, the first region is a drain region and the second region is a source region that is electrically connected to a ground potential, the metal-oxide semiconductor transistor further including a gate region that is electrically connected to a control line.

26. The nonvolatile memory cell array according to claim 25, further comprising:

a reference resistor corresponding to the nonvolatile memory cell; and an amplifier having a first input and a second input, the first input being electrically connected to the second conductive line, the second input being electrically connected to the reference resistor, the amplifier outputting a signal related to a sensed resistance of the magnetic tunnel junction device with respect to a sensed resistance of the reference resistor.

* * * * *